(12) United States Patent
Tsuchida et al.

(10) Patent No.: US 9,430,334 B2
(45) Date of Patent: Aug. 30, 2016

(54) FAILURE STORAGE DEVICE AND FAILURE STORAGE METHOD

(71) Applicant: NISSAN MOTOR CO., LTD., Yokohama-shi, Kanagawa (JP)

(72) Inventors: Toshihiro Tsuchida, Zama (JP); Shinsuke Yonetani, Machida (JP)

(73) Assignee: NISSAN MOTOR CO., LTD., Yokohama-shi (JP)

( * ) Notice: Subject to any disclaimer, the term of this patent is extended or adjusted under 35 U.S.C. 154(b) by 0 days.

(21) Appl. No.: 14/428,487

(22) PCT Filed: Aug. 1, 2013

(86) PCT No.: PCT/JP2013/070942
§ 371 (c)(1),
(2) Date: Mar. 16, 2015

(87) PCT Pub. No.: WO2014/045727
PCT Pub. Date: Mar. 27, 2014

(65) Prior Publication Data
US 2015/0234714 A1    Aug. 20, 2015

(30) Foreign Application Priority Data

Sep. 18, 2012  (JP) ................................. 2012-203884

(51) Int. Cl.
*G06F 11/00* (2006.01)
*G06F 11/14* (2006.01)
*G06F 11/07* (2006.01)

(52) U.S. Cl.
CPC ....... *G06F 11/1458* (2013.01); *G06F 11/0727* (2013.01); *G06F 11/0751* (2013.01); *G06F 2201/805* (2013.01)

(58) Field of Classification Search
CPC .................................................. G06F 11/0775
See application file for complete search history.

(56) References Cited

U.S. PATENT DOCUMENTS

| 6,898,494 B2 | 5/2005 | Nada |
| 2014/0189460 A1* | 7/2014 | Katagiri ............ H03M 13/2957 714/755 |

FOREIGN PATENT DOCUMENTS

| JP | 5-260604 A | 10/1993 |
| JP | 9-146630 A | 6/1997 |
| JP | 2000-032604 A | 1/2000 |
| JP | 2001-317403 A | 11/2001 |
| WO | WO 2009/054847 A1 | 4/2009 |

* cited by examiner

*Primary Examiner* — Christopher McCarthy
(74) *Attorney, Agent, or Firm* — Foley & Lardner LLP

(57) ABSTRACT

The failure storage device includes a failure storage control unit configured to, when a failure determination unit detects a failure of a target to be controlled, carry out failure storage processing to select data to be stored depending on failure details of the detected failure and store the selected data in a failure analysis data storage unit and a failure name storage unit as storage means, wherein, in the failure storage processing, when several failures are detected within a prescribed period of time, the failure storage control unit stores failure details of an initial failure in the failure name storage unit, stores data selected in accordance with the failure in the failure analysis data storage unit, and stores only failure details of other failures detected after the initial failure in the failure name storage unit.

8 Claims, 9 Drawing Sheets

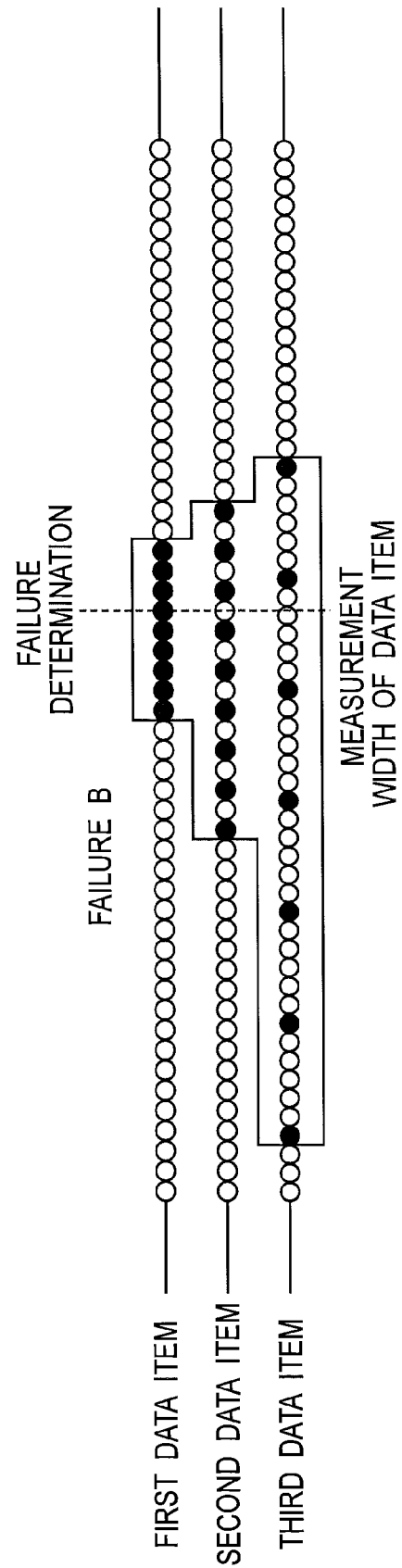

FAILURE STORAGE DEVICE AND FAILURE STORAGE METHOD

TECHNICAL FIELD

The present invention relates to failure storage devices and failure storage methods suitable for failure detection in, for example, electric vehicles.

BACKGROUND ART

In general, when a failure occurs in an electric vehicle or the like, data concerning current and voltage in each component at the time of occurrence of the failure is stored in order to investigate the cause of the failure later.

Such a failure storage device is required to have a large storage capacity to store all necessary data with regard to failures caused.

Here, there is known a technique for preliminarily determining degrees of importance of failure details and, when new failures more important than existing failures currently stored are caused, overwriting the existing failures to store the new important failures (for example, refer to Patent Literature 1).

This technique can reliably store failures with greater importance with a small storage capacity so as to analyze the important failures more reliably than a case of automatically overwriting existing failures to store new failures.

CITATION LIST

Patent Literature

Patent Literature 1: Japanese Unexamined Patent Application Publication No. 2000-032604

SUMMARY OF INVENTION

There are various types of causes of failures. For example, there is a case where "failure a" occurs first and "failure b" consecutively occurs in association with the first failure a. If data concerning the following failure b is only stored and analyzed, the cause of the failure may not be found out. Thus, it is in general necessary to store and analyze data concerning the first failure a caused before the failure b.

However, when records of failures are determined depending on degrees of importance as described in the conventional case, it may be difficult to precisely carry out failure analysis because, if the following failure b is more important, the data of the first failure a is overwritten so that the data of the following failure b is only stored.

The present invention has been made in view of the above-described problems. An object of the present invention is to provide a failure storage device and a failure storage method capable of storing details and data of failures for carrying out precise failure analysis while preventing an increase in storage capacity for data with regard to failures.

In order to achieve the object described above, a failure storage device according to the present invention includes a failure storage control unit configured to, when a failure detection unit detects a failure of a target to be controlled, carry out failure storage processing to select data to be stored depending on detected failure details and store the selected data in a storage unit, wherein, in the failure storage processing, when a plurality of failures are detected within a prescribed period of time, the failure storage control unit stores, in the storage unit, failure details of an initial failure detected first and data selected in accordance with the failure and stores only failure details of other failures detected after the initial failure.

In the failure storage device according to the present invention, the failure storage control unit carries out the failure storage processing at the of line of occurrence of failures. When several failures occur sequentially within a prescribed period of time, the failure storage control unit stores, in the storage unit, failure details including a failure name of an initial failure (A) detected first and data selected in accordance with the failure. In addition, the failure storage control unit stores, in the storage unit, only failure details including a failure name of another failure (B) detected after the initial failure within the prescribed period of time but does not store any failure caused after a lapse of the prescribed period of time.

Thus, the failure storage device can recognize failure details of multiple failures sequentially caused and recognize a time-series relationship of the failures. In addition, the failure storage device stores the data selected in accordance with the initial failure (A) caused first so as to carry out the specific analysis thereof. The failure storage device, however, stores no data with regard to other failures caused after the initial failure so as to decrease a required storage capacity compared with a device which stores all data concerning multiple failures sequentially caused. Further, since the failure storage device does not store non-sequential failures caused after a lapse of the predetermined period of time, the necessary storage capacity can be decreased to a much lower level in such a manner as to exclude records of details of failures with low necessity for the analysis of the initial failure caused first.

BRIEF DESCRIPTION OF DRAWINGS

FIG. 6B is a view for explaining the operation of the failure storage device of Embodiment 2 while showing a modified example of the measurement width and the sampling period of FIG. 6A.

DESCRIPTION OF EMBODIMENTS

Hereinafter, embodiments for implementing a failure storage device according to the present invention will be explained by reference to the drawings.

Embodiment 1

A failure storage device according to Embodiment 1 is explained below.

Figure 4:
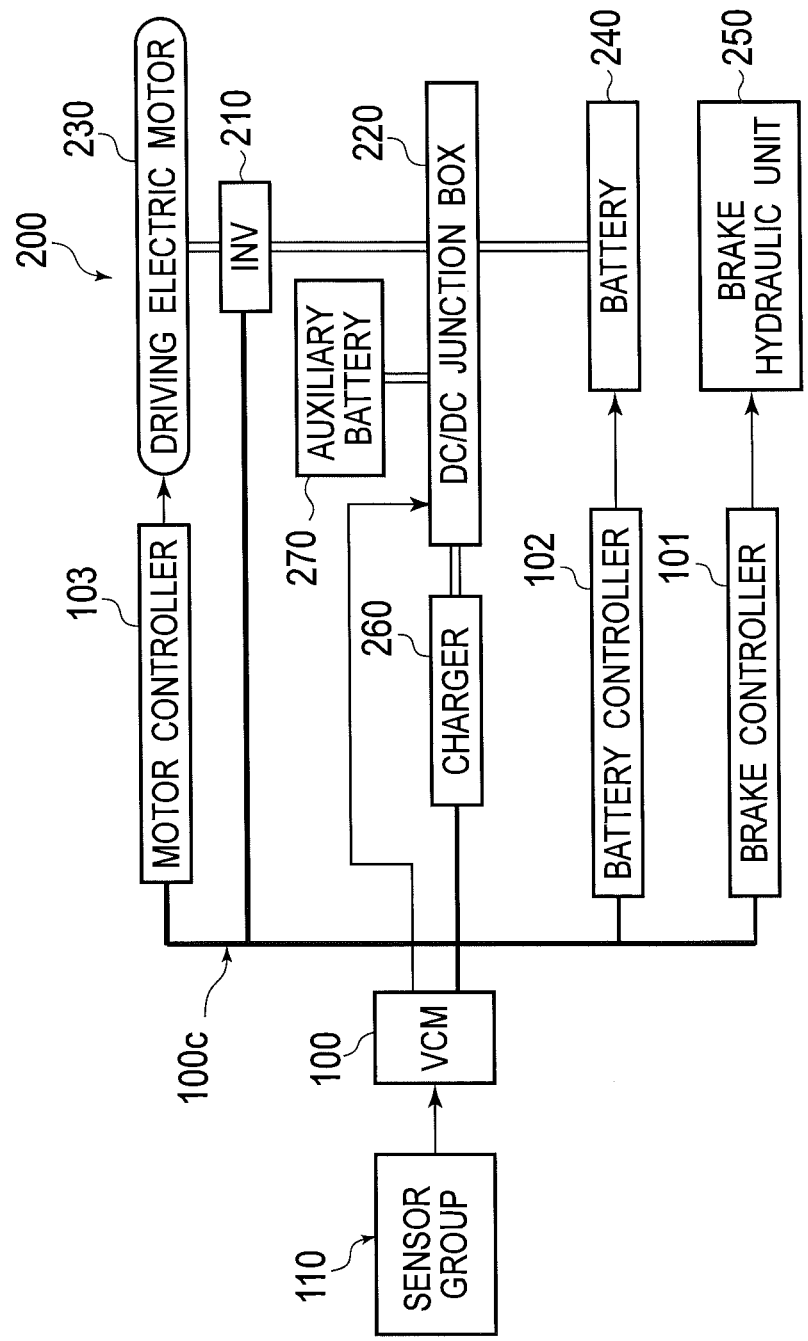
FIG. 4 is a diagram showing an entire system in an electric vehicle equipped with the failure storage device of Embodiment 1.

First, a configuration of a control system of an electric vehicle equipped with the failure storage device according to Embodiment 1 is briefly explained by reference to FIG. 4.

A braking control system of a braking control device of Embodiment 1 includes an integration controller 100, a brake controller 101, and a motor controller 103.

The integration controller 100 functions to start up and shut down the EV system, calculate driving force and issue motor output instructions, calculate deceleration, issue motor/brake output instructions, examine the EV system, and ensure a fail-safe operation.

The integration controller 100 integrates and controls the brake controller 101 and the motor controller 103 to obtain driver-request braking torque at the time of regenerative cooperative braking controlling. The integration controller 100 receives input information such as battery charge capacity information from a battery controller 102, speed information from a sensor group 110, braking operation information, and master cylinder hydraulic pressure information.

The brake controller 101 receives input of a signal from the integration controller 100 and the master cylinder hydraulic pressure information of a brake hydraulic unit 250. The brake controller 101 outputs a drive instruction to the brake hydraulic unit 250 and a target value of regenerative cooperative braking torque to the integration controller 100 according to a prescribed control rule.

The motor controller 103 is connected via an inverter 210 to a driving electric motor 230 connected to driving wheels (not shown in the figure). The motor controller 103 controls motor torque and a motor rotation rate by the driving electric motor 230 during the driving operation, and controls regenerative braking torque generated by the driving electric motor 230 according to a regenerative portion instruction during the braking operation.

A battery 240 is connected with the inverter 210 and a charger 260 via a DC/DC junction box 220. The DC/DC junction box 220 is connected with an auxiliary battery 270 from which electric power is supplied to the respective controllers 100 to 103.

Figure 1:
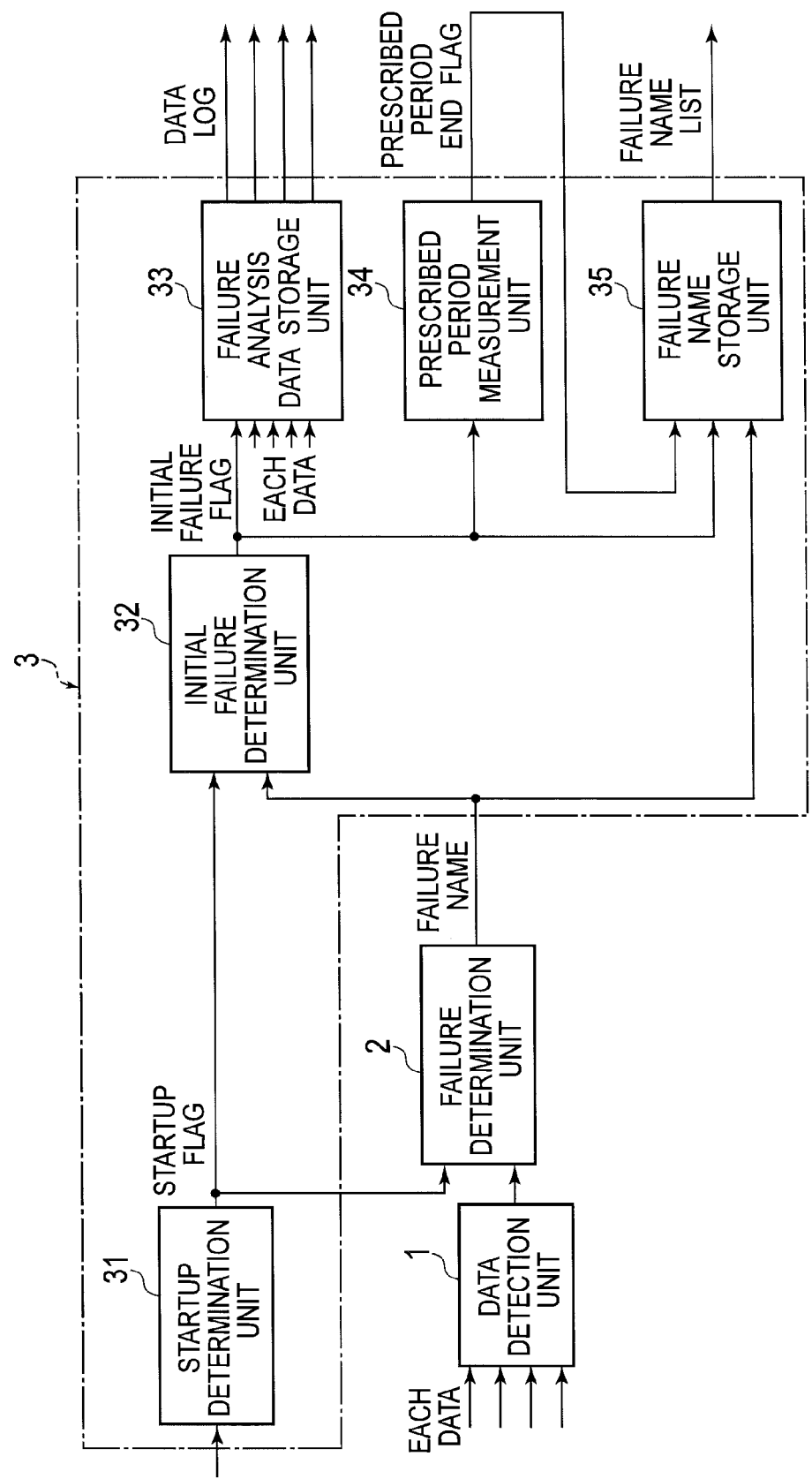
FIG. 1 is a block diagram showing a main part of a failure storage device of Embodiment 1.

Next, a configuration of the failure storage device according to Embodiment 1 is explained by reference to FIG. 1.

The failure storage device according to Embodiment 1 is installed in one of the controllers 100 to 103, for example, in the integration controller 100 and includes a data detection unit 1, a failure determination unit 2 and a failure storage control unit 3.

The data detection unit 1 detects various data with regard to targets to be controlled (such as the inverter 210, the DC/DC junction box 220, the driving electric motor 230, the battery 240, and the brake hydraulic unit 250) from the sensor group 110 and the respective controllers 101 to 103.

The failure determination unit 2 determines a failure depending on whether data input to the data detection unit 1 falls within a range of predetermined normal values or corresponds to abnormal values other than the normal values.

The failure storage control unit 3 includes a startup determination unit 31, an initial failure determination unit 32, a failure analysis data storage unit 33, a prescribed period measurement unit 34, and a failure name storage unit 35.

The startup determination unit 31 determines a startup and shutdown of the entire failure storage device according to Embodiment 1. The startup determination unit 31 outputs a startup flag to the failure determination unit 2 and the initial failure determination unit 32 when the electric vehicle is in a startup state ready for driving and the respective controllers 100 to 103 are activated, and stops outputting the startup flag when the electric vehicle is in a non-active state after stopping driving.

The failure determination unit 2 carries out the failure determination described above during the input of the startup flag from the startup determination unit 31, and finishes the failure determination to be initialized once the input of the startup flag is stopped. When the failure determination unit 2 determines the occurrence of the failure, the failure determination unit 2 outputs a failure name representing details of the failure to the initial failure determination unit 32 and the failure name storage unit 35.

The initial failure determination unit 32 is active during the input of the startup flag, determines whether the failure is the initial failure, and finishes the determination so as to be initialized once the input of the startup flag is stopped. When the failure name received from the failure determination unit 2 is the first one after the input of the startup flag, the initial failure determination unit 32 sends an initial failure flag indicating the occurrence of the initial failure to the failure name storage unit 35, the failure analysis data storage unit 33 and the prescribed period measurement unit 34.

The failure analysis data storage unit 33 selects data items to be stored corresponding to the failure details by use of the initial failure flag as a trigger indicating the occurrence of the initial failure received from the initial failure determination unit 32, and stores each piece of data with regard to the respective data items before and after the failure determination in a time-series manner. Here, in the failure analysis data storage unit 33, one or more data items (for example, a current value, a voltage value, and an output pulse) corresponding to failure details (failure names) are preliminarily determined. Once the initial failure flag is input, the failure analysis data storage unit 33 stores the selected data with regard to the data items determined corresponding to the failure details (the failure name) from various data obtained via the data detection unit 1. At the time of data storage, the failure analysis data storage unit 33 stores the data before and after the determination of the failure occurrence in a time-series manner. Thus, the failure analysis data storage unit 33 functions concurrently as a failure storage control means and a storage means.

A specific example of the storage process is explained below with regard to failure A shown in the time chart of FIG. 3 for explaining the operation. When failure A occurs at point t11, each data (d11 to d15, d21 to d25, d31 to d35) with regard to first to third data items necessary for failure A between point t110 and point t111 around point t11 is stored in a time-series manner.

Returning to FIG. 1, the prescribed period measurement unit 34 starts measuring a prescribed period ("pt" in FIG. 3) which is a set time in which the initial failure flag input at the time of occurrence of the initial failure is preliminarily determined as a trigger. The prescribed period measurement unit 34 sends, to the failure name storage unit 35, a prescribed period end flag at the point of a lapse of the prescribed period pt to notify the termination of the prescribed period pt.

The failure name storage unit 35 functions as a storage means to store failure details (failure names) of failures caused until the prescribed period end flag is input thereto by use of the initial failure flag as a trigger input at the time of occurrence of the initial failure. The failure name storage unit 35 receives the prescribed period end flag to stop storing the failure names.

Figure 2:
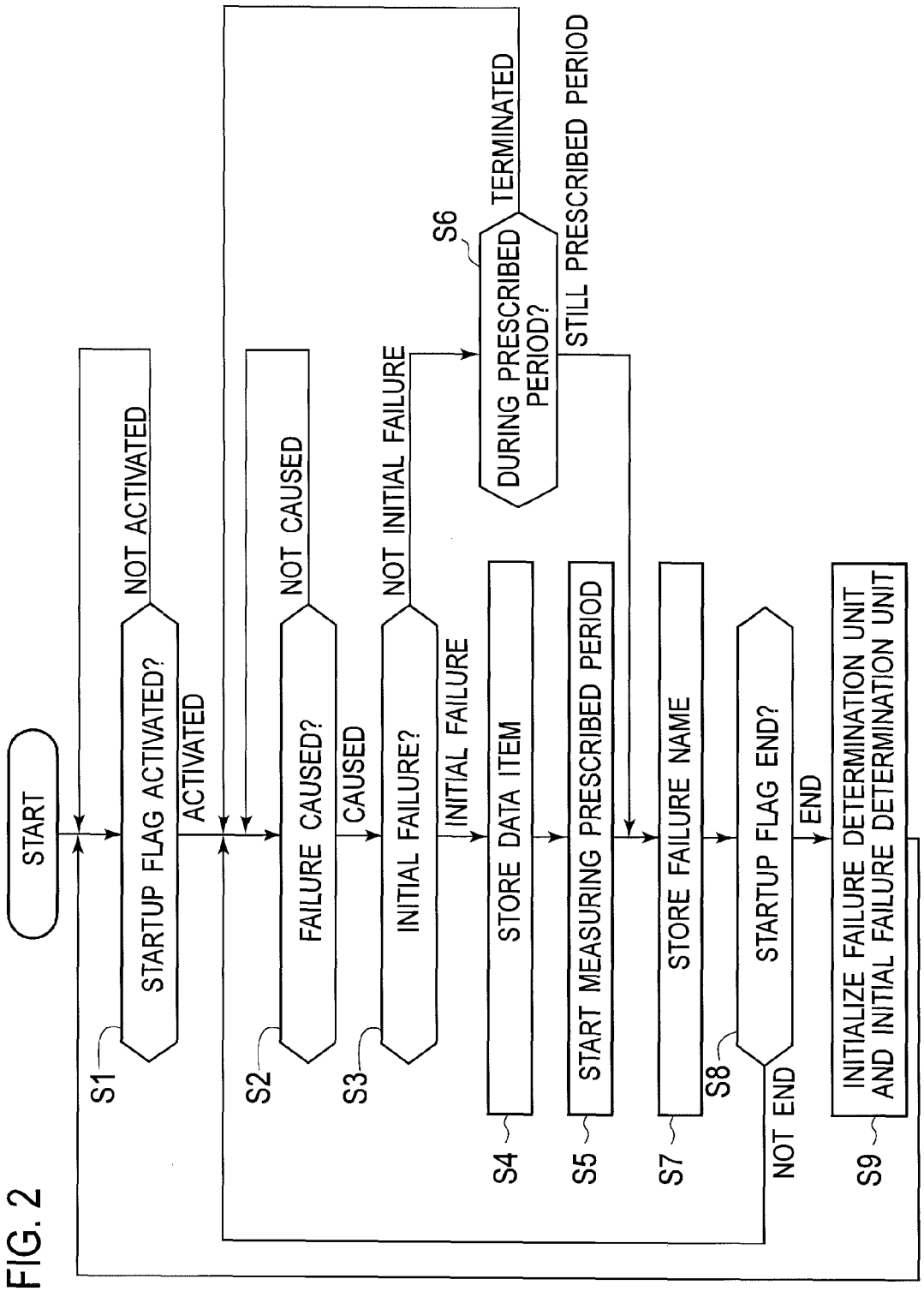
FIG. 2 is a flow chart showing a procedure of failure storage processing of the failure storage device of Embodiment 1.

Next, a procedure of failure storage processing performed by the failure storage control unit 3 is explained by reference to FIG. 2.

In step S1, the startup determination unit 31 determines whether the startup flag is activated, namely, whether the failure storage device is activated, and proceeds to step S2 when the startup flag is active or repeats the determination of step S1 when the startup flag is not active.

In step S2 when the startup flag is active, the failure determination unit 2 determines whether a failure occurs, and proceeds to step S3 when confirming the occurrence of the failure or repeats the determination of step S2 when not recognizing the occurrence of the failure.

In step S3 when confirming the occurrence of the failure, the initial failure determination unit 32 determines whether the failure is the initial failure, and proceeds to step S4 when the failure is the initial failure or proceeds to step S6 when the failure is not the initial failure.

In step S4 when the failure is the initial failure, the failure analysis data storage unit 33 selects data items with regard to the initial failure and stores data with regard to the selected data items to then proceed to step S5.

In step S5, the prescribed period measurement unit 34 starts measuring the prescribed period pt to then proceed to step S7.

In step S6 when the failure is not the initial failure in step S3, it is determined whether the measurement of the prescribed period pt started in step S5 is still in progress, and the process proceeds to step S7 when the measurement is in progress or returns to step S2 when the predetermined period pt has terminated.

In step S7, the failure name storage unit 35 stores the detected failure details (the failure name) to proceed to step S8. Here, the failure name storage unit 35 first stores the initial failure caused at the point of starting measuring the prescribed period pt and then stores names of failures sequentially caused during the measurement of the prescribed period pt.

In step S8, it is determined whether the startup flag is stopped, and the process returns to step S2 when the startup flag is not stopped or proceeds to step S9 when the startup flag is stopped.

In step S9, the failure determination unit 2 and the initial failure determination unit 32 are initialized, and the process returns to step S1.

(Explanation of Function)

The function of Example 1 is explained by reference to the time chart shown in FIG. 3.

Figure 3:
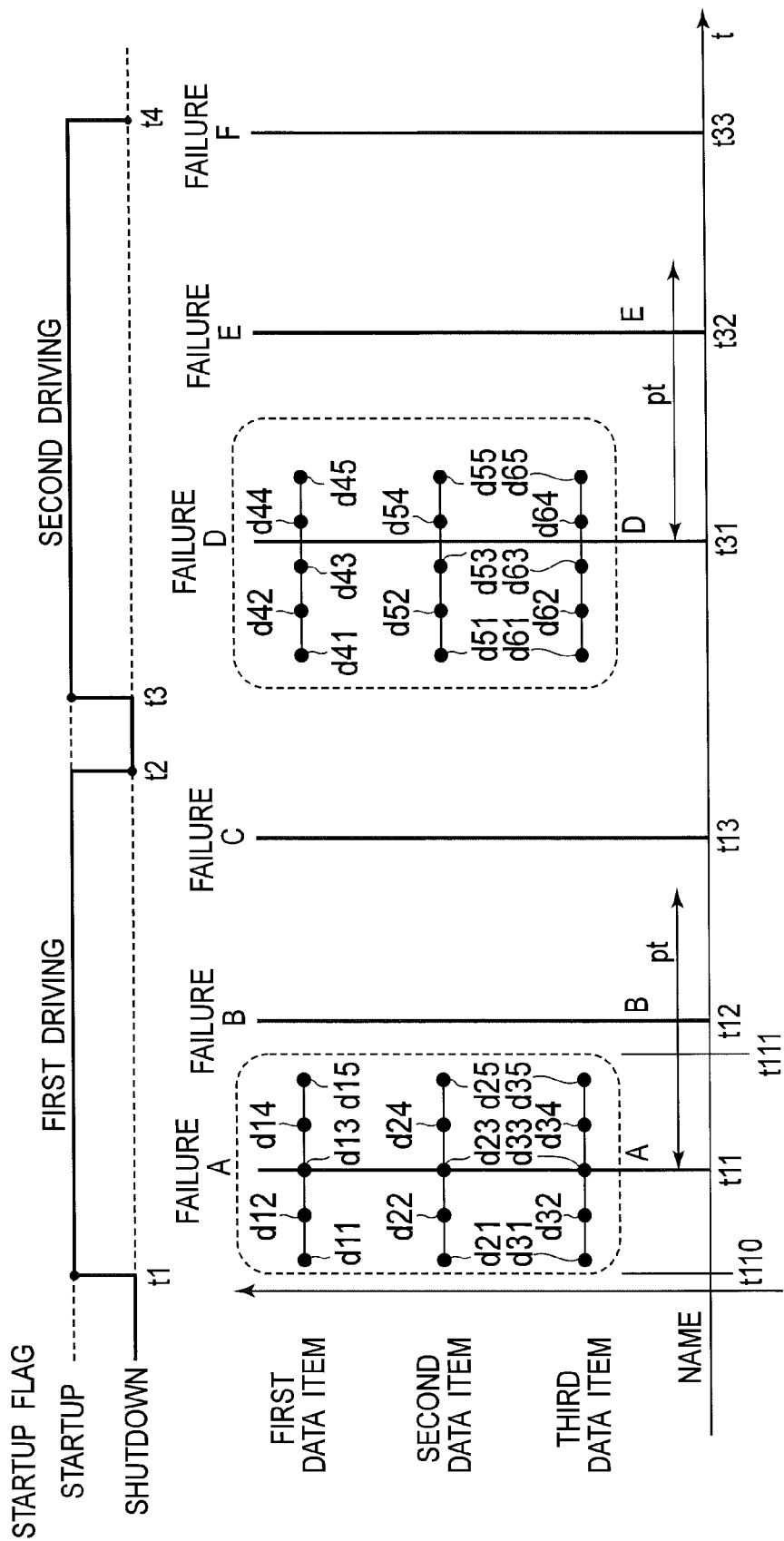
FIG. 3 is a time chart showing an example of operation of the failure storage device of Embodiment 1.

FIG. 3 exemplifies a case where failures A, B and C occur between point t1 and point t2 during first driving and a case where failures D, E and F occur between point t3 and point t4 during second driving.

The startup determination unit 31 activates a startup flag at each of point t1 and point t3 where the first driving and the second driving start, and ends the startup flag at each of point t2 and point t4 where each driving ends. The failure determination unit 2 and the initial failure determination unit 32 each carry out the determination while the startup flag is active.

First, the operation in the case where failures A, B and C occur during the first driving is explained. When the failure determination unit 2 determines that failure A occurs as an initial failure (recognizes the occurrence in step S2), the failure determination unit 2 outputs, to the initial failure determination unit 32 and the failure name storage unit 35, the information indicating the occurrence of failure A in addition to the failure details (the failure name).

Since failure A is the initial failure, the initial failure determination unit 32 outputs the initial failure flag to the failure analysis data storage unit 33, the prescribed period measurement unit 34 and the failure name storage unit 35.

The failure analysis data storage unit 33 receives the initial failure flag, selects data items (first to third data items) preliminarily determined to be used for the analysis of failure A from various data, and stores each piece of data with regard to the respective data items before and after the occurrence of failure A (based on the process of step S4) in the failure analysis data storage unit 33. In the example shown in FIG. 3, three types of data items of the first data item, the second data item and the third data item with regard to failure A are assigned. The failure analysis data storage unit 33 thus stores each data d11 to d15, d21 to d25 and d31 to d35 with regard to the first to third data items in a time-series manner.

In parallel with this process, the prescribed period measurement unit 34 receives the initial failure flag and starts measuring the prescribed period pt from point t11 where failure A occurred (in step S5). Further, the failure name storage unit 35 stores the failure details (the failure name) of failure A (in step S7).

As illustrated in FIG. 3, when failure B occurs at point t12 during the measurement of the prescribed period pt, the failure determination unit 2 outputs, to the initial failure determination unit 32 and the failure name storage unit 35, the information indicating the occurrence of failure B in addition to the failure details (the failure name), as in the case of the occurrence of failure A.

Since failure B is the second failure, the initial failure determination unit 32 outputs no initial failure flag, and the failure analysis data storage unit 33 stores no data item.

The failure name storage unit 35 stores the failure details (the failure name) of failure B (based on the procedure of step S3→step S6→step S7).

As an example of sequentially caused failures, such as failures A and B, there is a case of causing an initial failure of an abnormal decrease in voltage of the auxiliary battery 270 and causing a following failure of an abnormal output by the control device such as the motor controller 103 supplied with electric power from the auxiliary battery 270.

In the example shown in FIG. 3, non-sequential failure C occurs at point t13. Since the measurement of the prescribed period pt has been finished at point t13 where failure C occurs, the failure details (the failure name) of failure C are not stored so that no data is stored (based on the sequence of step S2→step S3→step S6→step S2).

Accordingly, the failure name storage unit 35 stores failure A as an initial failure and failure B as a following failure in a time-series manner when stopping driving at point t2. In addition, the failure analysis data storage unit 33 stores each data d11 to d15, d21 to d25 and d31 to d35 before and after the occurrence of failure A (point t11).

Thus, at the time of analyzing the failures, the list of the failure names including the initial failure A and the following failure sequentially caused thereafter (failure A, failure B) can be extracted from the failure name storage unit 35. Further, the time-series data before and after the initial failure A can be extracted from the failure analysis data storage unit 33.

Also during the following second driving, the failure details (the failure name) and each data d41 to d45, d51 to d55 and d61 to d65 of the first to third data items with regard to failure D occurring first at point t31 are stored, as in the case of the first driving. Here, the details of the first to third data items may be common to or different from the details of the respective data items determined at the time of occurrence of failure A. Subsequently, the failure name storage unit 35 stores the failure details (the failure name) of failure E sequentially caused during the prescribed period pt in a time-series manner. However, the failure name storage unit 35 does not store the failure details (the failure name) of the non-sequential failure F caused after a lapse of the prescribed period pt.

The following are effects of the failure storage device according to Embodiment 1.

(a) The failure storage device according to Embodiment 1 includes:

the data detection unit 1 as a data detection means for detecting data indicating conditions of a target to be controlled;

the storage means (the failure analysis data storage unit 33, the failure name storage unit 35) for storing the data;

the failure determination unit 2 as a failure detection means for detecting failures of the target to be controlled; and the failure storage control unit 3 as a failure storage control means for, when a failure is detected, carrying out failure storage processing to select data to be stored depending on failure details detected and to store the selected data in the storage means, wherein, in the failure storage processing, when a plurality of failures are detected within a prescribed period (a set time) pt, the failure storage control unit 3 controls the failure analysis data storage unit 33 and the failure name storage unit 35 to store failure details of the initial failure detected first (failure A or D) and data selected in accordance with the failure (d11 to d15, d21 to d25, d31 to d35 or d41 to d45, d51 to d55, d61 to d65) and to store only details of other failures detected after the initial failure.

Since the failure name storage unit 35 stores the failure details (the failure name) of failure B or E sequentially caused after failure A or D, the failure storage device can recognize a time-series relationship of the failures and carry out the failure analysis in more detail than a conventional device which stores only the last failure. In particular, since the conventional device stores failure details and data with regard to only a failure with a higher degree of importance among failures A to F, the details and data with regard to the sequential failures A and B or the sequential failures D and E may not be stored. As a result, it may be difficult to carry out the failure analysis with regard to the sequential failures A and B or the sequential failures D and E.

On the other hand, the failure storage device of Embodiment 1 stores, in a time-series manner, the failure details (the failure names) of the sequential failures A and B or the sequential failures D and E so that the specific analysis thereof can be possible.

In addition, the data items (first to third) necessary for the analysis are selected for the respective initial failures A and D with regard to the sequential failures A and B and the sequential failures D and E. Further, the data d11 to d15, d21 to d25, d31 to d35 and d41 to d45, d51 to d55, d61 to d65 of the respective data items before and after the occurrence of the initial failures A and D are stored in a time-series manner. Thus, the specific failure analysis can be carried out with regard to the failures A and D most necessary for analyzing the causes in the sequentially-caused failures.

In addition, since the failure details of the respective failures B and E sequentially caused after the initial failures A and D are only stored while no data is stored, the required storage capacity can be decreased compared with a case where data of all failures are stored.

In addition, no failure detail (failure name) is stored with regard to the failure (C, F) caused after a lapse of the prescribed period pt from the occurrence of the initial failure (A, D) because the failure (C, F) is a non-sequential failure. Accordingly, the required storage capacity can be further decreased in such a manner as to eliminate records of the failure details of the failure not sequentially caused after the initial failure (A, D) and having lower necessity for the analysis of the initial failure caused first.

(b) The failure storage device according to Embodiment 1 implements a failure storage method including:

a step (S2) of detecting failures of a target to be controlled based on data;

a step (S3, S4) of, when the failures are detected in the step (S2), selecting failure details of an initial failure detected first and data to be stored from the data in accordance with the failure details and storing the selected failure details and data in the failure analysis data storage unit 33 as a storage means; and a step (S5, S7, S3, S6) of measuring a prescribed period of time from the point at which the initial failure is detected and, when another one or more failures are detected after the initial failure during measuring the prescribed period of time, storing only failure details of the other failures in the failure name storage unit 35 as a storage unit.

Since the failure details (the failure names) of the sequential failures A and B and the sequential failures D and E are stored in a time-series manner, the specific analysis thereof can be possible, as in the case of the feature (a) described above.

In addition, the data d11 to d15, d21 to d25, d31 to d35 and d41 to d45, d51 to d55, d61 to d65 before and after the occurrence of the initial failures A and D are stored in a time-series manner with regard to the data items (first to third) necessary for the analysis of the initial failures A and D of the sequential failures A and B and the sequential failures D and E. Thus, the specific failure analysis can be carried out with regard to the failures A and D most necessary for analyzing the causes in the sequentially-caused failures.

In addition, since the failure details of the failures B and E sequentially caused after the initial failures A and D are only stored, the required storage capacity can be decreased compared with the case where data of all failures are stored.

In addition, since no failure detail (failure name) is stored with regard to the non-sequential failure (C, F) caused after a lapse of the prescribed period pt from the occurrence of the initial failure (A, D), the required storage capacity can be further decreased.

(c) In the failure storage device according to Embodiment 1, the failure storage control unit 3 carries out the data storage in the failure storage processing only once during the period from the startup to the shutdown of the device.

Thus, the storage capacity of the device can be decreased to a lower level than the case where all failures are stored. In addition, complication in analysis operation derived from a process of storing failures having little relevance to the initial failure can be prevented.

(d) In the failure storage device according to Embodiment 1, the failure storage control unit 3 includes the failure analysis data storage unit 33 as a data item determination unit for determining data items to be obtained depending on failures when data is stored in the failure storage processing.

Only the data items necessary for the analysis in accordance with each failure are stored so as to avoid storing data unnecessary for the analysis, decrease the required storage capacity, and carry out the sufficient and specific analysis.

Other Embodiments

Hereinafter, failure storage devices according to other embodiments will be explained.

The other embodiments are modified examples of Embodiment 1 and therefore, the elements common to those in Embodiment 1 are indicated by the same reference numerals, and overlapping explanations thereof are not repeated but elements different from those in Embodiment 1 are only explained below.

Embodiment 2

A failure storage device of Embodiment 2 differs from that of Embodiment 1 in a storage method of a failure analysis data storage unit 233.

Figure 5:
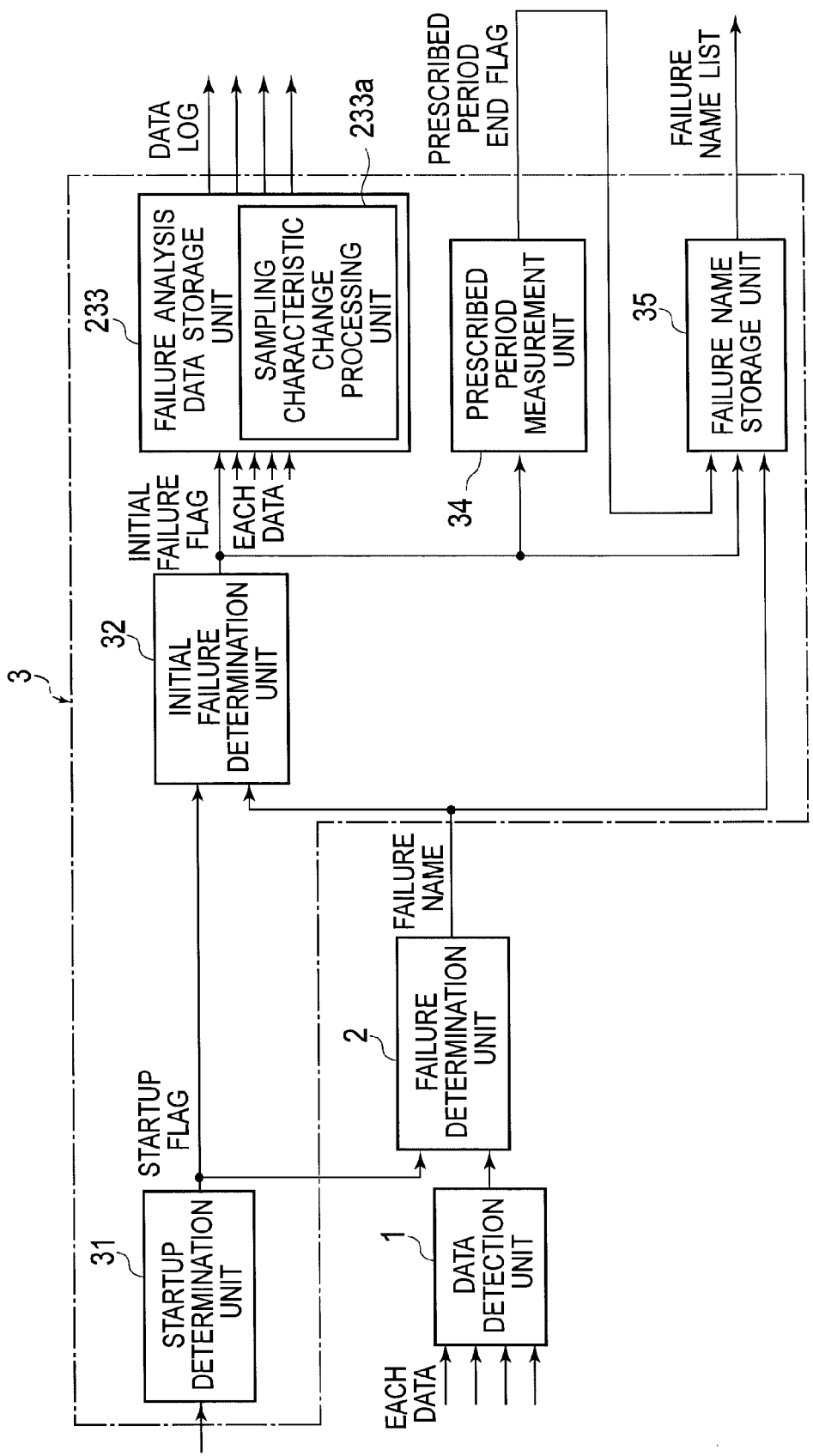
FIG. 5 is a block diagram showing a main part of a failure storage device of Embodiment 2.

In Embodiment 2, the failure analysis data storage unit 233 shown in FIG. 5 includes a sampling characteristic change processing unit 233a capable of changing a measurement width and a sampling period depending on data items to be stored at the time of storing data in failure storage processing.

The operation of the sampling characteristic change processing unit 233a is explained below by reference to FIG. 6.

Figure 6A:
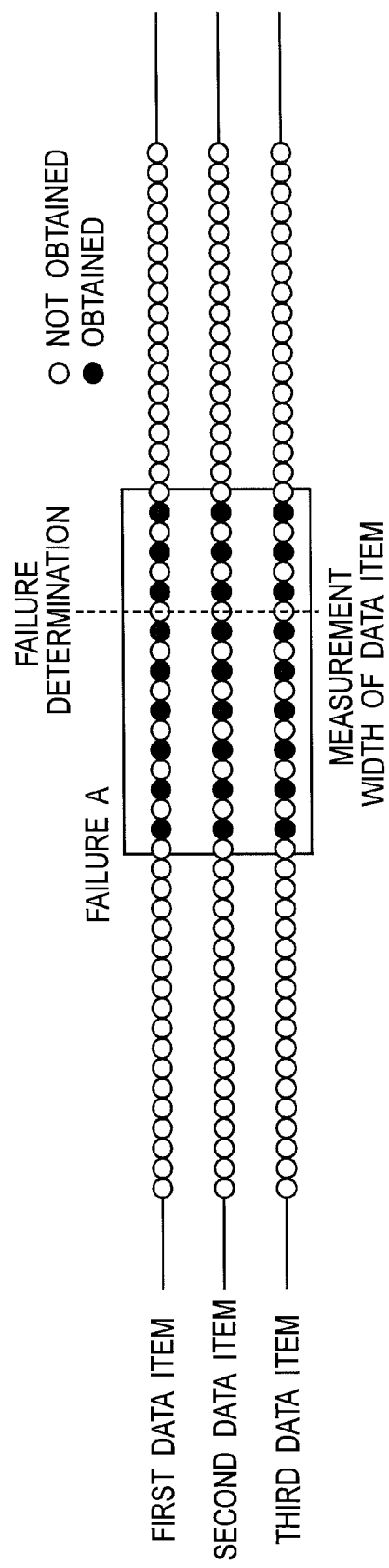
FIG. 6A is a view for explaining the operation of the failure storage device of Embodiment 2 while showing an example of a measurement width and a sampling period similar to those in Embodiment 1.

For example, FIG. 6A exemplifies the operation of the sampling characteristic change processing unit 233a when failure A occurs. In this case, the failure analysis data storage unit 233 stores each data of first to third data items having a common measurement width and sampling period.

FIG. 6B exemplifies the operation of the sampling characteristic change processing unit 233a when failure B occurs. In this case, the sampling characteristic change processing unit 233a changes measurement widths and sampling periods of the first data item and the third data item, which are different from the case of failure A shown in FIG. 6A.

In particular, with regard to the first data item, the number of pieces of sampling data is the same as that in failure A, but both the measurement width and the sampling period are shortened. For example, when the first data item of failure B includes data changing in a short period of time such as a current flowing in the driving electric motor 230, at least the measurement width or the sampling period is preferably shortened so as to obtain specific data. Thus, as shown in FIG. 6B, both the measurement width and the sampling period are shortened with regard to the first data item so as to reliably obtain a change of data in a short period of time while suppressing the total volume of data to be obtained.

With regard to the third data item, both the measurement width and the sampling period are lengthened. In such a case, the number of pieces of the sampling data is smaller than that in failure A. For example, when the third data item of failure B includes data not rapidly changing in a short period of time such as a battery temperature, both the measurement width and the sampling period are lengthened to separate the sampling data by increasing data not to be obtained, so that the specific failure analysis can be carried out with less volume of data.

Here, with regard to the second data item, failure B has substantially the same measurement width and the same sampling period as failure A.

In addition, the measurement width and the sampling period described above vary depending on the characteristics of the respective data items, the analysis method, or the type of data necessary for the analysis described above, which vary depending on failure details.

(e) In the failure storage device according to Embodiment 2, the failure storage control unit 3 includes the sampling characteristic change processing unit 233a capable of changing at least one of the measurement width and the sampling period depending on data items to be stored at the time of storing data in the failure storage processing.

This enables the specific failure analysis based on the data items stored in accordance with the failure details without increasing the volume of data to be stored. For example, although it may be possible to achieve specific failure analysis by constantly lengthening the measurement width or shortening the sampling period with respect to all data items, it requires a large storage capacity for data. On the other hand, this embodiment can carry out the specific analysis in accordance with the failure details in such a manner as to determine the measurement width and the sampling period of the data items as appropriate depending on the failure details without increasing the storage capacity.

Further, Embodiment 2 can change and determine both the measurement width and the sampling period so as to concurrently achieve the specific failure analysis and prevent the storage capacity from increasing more reliably than the case of changing one of the measurement width and the sampling period.

Embodiment 3

Figure 7:
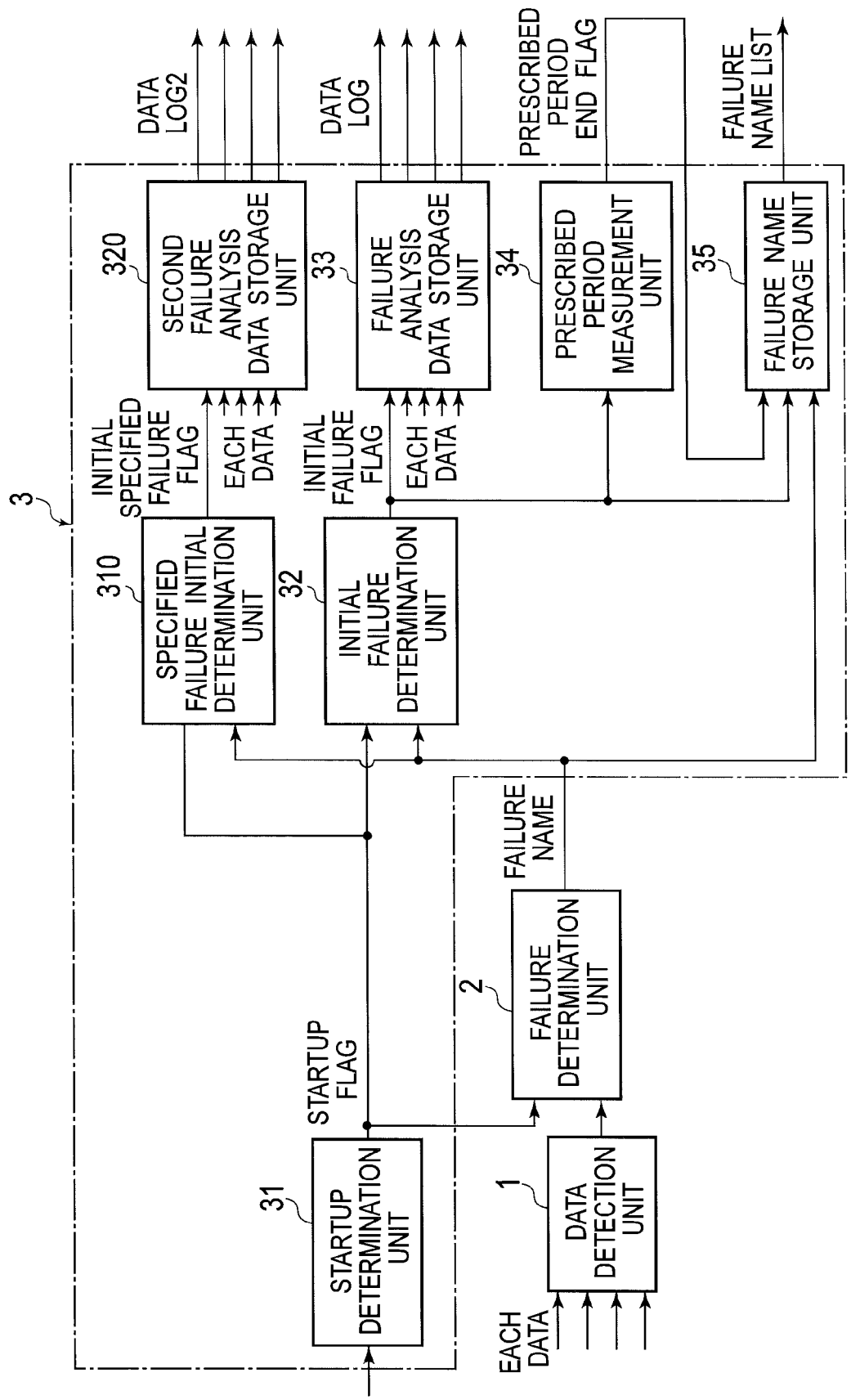
FIG. 7 is a block diagram showing a main part of a failure storage device of Embodiment 3.

FIG. 7 illustrates a failure storage device according to Embodiment 3.

Embodiment 3 further includes, in the failure storage control unit 3, a specified failure initial determination unit 310 and a second failure analysis data storage unit 320.

The specified failure initial determination unit 310 determines whether a predetermined specified failure with a high degree of importance caused is an initial failure, and outputs an initial specified failure flag to the second failure analysis data storage unit 320 when the specified failure is the initial failure. Here, in the electric vehicle, the failure with a high degree of importance is, for example, a failure of the inverter 104 or a failure of the integration controller 100, the battery controller 102 or the motor controller 103 for controlling the inverter 104.

When the initial specified failure flag is input, the second failure analysis data storage unit 320 stores each data in a time-series manner with regard to the respective data items before and after the occurrence of the specified failure.

Thus, the second failure analysis data storage unit 320 stores each data of the data items of the specified failure when the failure is the initial failure regardless of the presence or absence of failures other than the specified failure.

Figure 8:
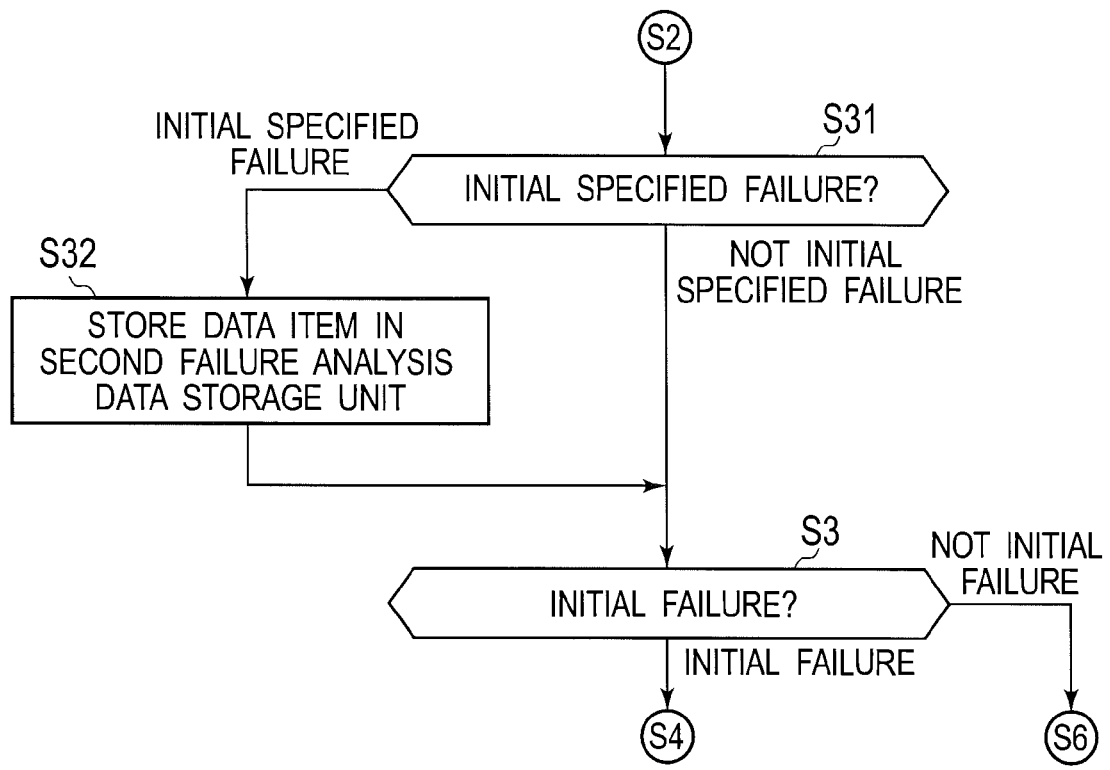
FIG. 8 is a flow chart showing main steps of failure storage processing of the failure storage device of Embodiment 3.

FIG. 8 illustrates a main part of the processing steps in failure storage controlling in Embodiment 3. These steps are added to the process at the time of occurrence of the failure in step S2 in the flow chart shown in FIG. 2 illustrating the procedure of the failure storage controlling in Embodiment 2.

In particular, in step S31 to which the process proceeds when the failure occurs in step S2, it is determined whether the failure is the initial specified failure, and the process proceeds to step S32 when the failure is the initial specified failure or proceeds to step S3 when the failure is not the initial specified failure.

In step S32, the second failure analysis data storage unit 320 stores each data of the respective data items before and after the occurrence of the initial specified failure to then proceed to step S3.

The other steps are the same as those in Embodiment 1, and the illustration in the figure and the explanations thereof are omitted here.

The following are effects of the failure storage device according to Embodiment 3.

(f) In the failure storage device according to Embodiment 3, the failure storage control unit 3 includes the specified failure initial determination unit 310 for determining, when a predetermined specified failure with a high degree of importance occurs, whether the specified failure is the initial failure after the activation of the device, and the second failure analysis data storage unit 320 for storing data selected in accordance with the specified failure when the failure is the initial failure.

In Embodiment 3, when the specified failure with a high degree of importance occurs, the data of the data items necessary for the analysis is stored regardless of the presence or absence of failures other than the specified failure and regardless of whether a prescribed period has passed after the occurrence of the failures other than the specified failure.

Thus, when the specified failure with a high degree of importance occurs, a fault that no data of the failure is stored can be prevented so that the analysis of the specified failure with a high degree of importance can reliably be carried out.

Although the failure storage device according to the present invention has been described above by reference to the embodiments, the specific configurations are not limited to the embodiments, and modifications and additions of design should be allowed without departing from the scope of claims.

Although Embodiment 1 exemplified the case of applying the failure storage device to the electric vehicle, the present invention is not limited to the application to the electric vehicle as long as the failure storage device detects and stores failures of targets to be controlled, and may be applied to other vehicles, industrial machinery, electric equipment, or the like.

Although the embodiments exemplified the case of storing three types of data items of data to be stored in the failure analysis data storage unit, the number of the data items for each failure is not limited to three and may be one or any other number other than three.

Although Embodiment 2 exemplified the case where the sampling characteristic change processing unit can change and determine both the measurement width and the sampling period, the sampling characteristic change processing unit may change one of the measurement width and the sampling period so as to store data in accordance with characteristics of data items while preventing an increase of volume of data to be stored more reliably than a case where sampling characteristics are constant.

MUTUAL REFERENCES OF THE RELATED PATENT APPLICATIONS

This application claims priority on the basis of Japanese Patent Application No. 2012-203884 filed with the Japan Patent Office on Sep. 18, 2012, and the entire disclosure is completely incorporated for reference in the present patent application.

The invention claimed is:

1. A failure storage device comprising:
    a data detection unit configured to detect data indicating a condition of a target to be controlled;
    a storage unit configured to store the data;
    a failure detection unit configured to detect a failure of the target to be controlled; and
    a failure storage control unit configured to, when the failure is detected, carry out failure storage processing to select data to be stored depending on a failure detail of the failure detected and store the selected data in the storage unit,
    in the failure storage processing, the failure storage control unit controlling the storage unit to store a failure detail of an initial failure detected first and data selected in accordance with the failure at a time of occurrence of the initial failure, and then, when another one or more failures are detected during measuring a prescribed period of time, to store only a failure detail of each failure other than the initial failure and store neither a failure detail nor data of a failure detected after a lapse of the prescribed period of time.

2. The failure storage device according to claim 1, wherein the failure storage control unit stores the data only once in the failure storage processing during a period from a startup to a shutdown of the failure storage device.

3. The failure storage device according to claim 1, wherein the failure storage control unit includes a sampling characteristic change processing unit capable of changing at least one of a measurement width and a sampling period depending on a data item to be stored when storing the data in the failure storage processing.

4. The failure storage device according to claim 1, wherein the failure storage control unit includes a data item determination unit for determining a data item to be obtained depending on each failure when storing the data in the failure storage processing.

5. The failure storage device according to claim 1, wherein the failure storage control unit includes a specified failure initial determination unit for determining, when a predetermined specified failure with a high degree of importance occurs, whether the specified failure is an initial specified failure caused after the failure storage device is activated, and a second failure analysis data storage unit for storing data selected in accordance with the specified failure when the specified failure initial determination unit determines that the specified failure is the initial specified failure.

6. The failure storage device according to claim 1, wherein the prescribed period of time is a set time period beginning from the point at which the initial failure is detected.

7. A failure storage method of detecting a failure of a target to be controlled based on data from a data detection unit which detects a condition of the target to be controlled and storing the data in a storage unit, the method comprising:
    a step of detecting the failure of the target to be controlled based on the data;
    a step of, when the failure is detected in the step of detecting the failure, selecting a failure detail of the failure detected first and data to be stored from the data in accordance with the failure detail and storing the selected failure detail and data in the storage unit; and a step of measuring a prescribed period of time from a point at which the failure is detected first and, when another one or more failures are detected after the failure is detected first during measuring the prescribed period of time, storing only a failure detail of each failure other than the failure detected first in the storage unit and storing neither a failure detail nor data of a failure detected after a lapse of the prescribed period of time.

8. The failure storage method according to claim 7, wherein the prescribed period of time is a set time period beginning from the point at which the failure is detected first.

* * * * *